United States Patent
Chen et al.

(10) Patent No.: US 6,291,628 B1
(45) Date of Patent: Sep. 18, 2001

(54) SOLVENT SYSTEMS FOR LOW DIELECTRIC CONSTANT POLYMERIC MATERIALS

(75) Inventors: Tian-An Chen, Duluth, GA (US); Kreisler S. Y. Lau, Sunnyvale; Qiang Zhao, San Jose, both of CA (US)

(73) Assignee: Allied Signal Inc., Morristown, NJ (US)

( * ) Notice: Subject to any disclaimer, the term of this patent is extended or adjusted under 35 U.S.C. 154(b) by 0 days.

(21) Appl. No.: 09/235,141

(22) Filed: Jan. 21, 1999

Related U.S. Application Data

(60) Provisional application No. 60/073,483, filed on Feb. 3, 1998.

(51) Int. Cl.[7] .................................................. C08G 79/02
(52) U.S. Cl. .......................... 528/169; 528/125; 528/167; 528/403; 528/410; 528/422; 528/480; 528/494; 528/503; 525/390; 428/411.1
(58) Field of Search ..................... 528/169, 125, 528/167, 403, 410, 422, 480, 471, 503, 494; 428/411.1; 525/390

(56) References Cited

U.S. PATENT DOCUMENTS 5,183,846   2/1993   Aiba et al. ........................... 524/865

FOREIGN PATENT DOCUMENTS

| 0 212 334 A2 | 3/1987 | (EP) | ................................. C03F/7/02 |
| 0 281 825 A2 | 9/1988 | (EP) | ................................. C09D/3/82 |
| 0 859 022 A1 | 8/1998 | (EP) | ................................. C08G/65/40 |

OTHER PUBLICATIONS

Purdy, et al., "The dissolution of copper in common solvents used for low dielectric polymers", Thin Solid Films, pp. 486–489 (1997).

*Primary Examiner*—Duc Truong
(74) *Attorney, Agent, or Firm*—Robert D. Fish; Fish & Associates, LLP

(57) ABSTRACT

A polymeric low dielectric constant solution includes a low dielectric constant polymer dissolved in an aromatic aliphatic ether solvent. The polymer preferably is a poly (arylene ether) and the solvent preferably is anisole, methylanisole, phenetole or mixtures thereof. A process for forming a dielectric film on a substrate by spin-coating the polymeric solution is also provided.

10 Claims, No Drawings

SOLVENT SYSTEMS FOR LOW DIELECTRIC CONSTANT POLYMERIC MATERIALS

RELATED APPLICATIONS

This application is the non-provisional application of the related provisional application entitled "Solvent System for Low Dielectric Constant Polymeric Materials," provisional Ser. No. 60/073,483, filed on Feb. 3, 1998, the benefit of whose priority date is hereby claimed, and the disclosure of which is incorporated herein by reference.

BACKGROUND

1. Field of the Invention

This application relates generally to low dielectric constant polymer materials and more particularly to solvent systems for use with arylene ether based polymer materials.

2. Description of the Related Art

As the dimension of the interconnect design rules for integrated circuits (IC) undergoes progressive shrinkage to sub-quarter micron metal spacing, the use of organic polymer dielectrics to minimize capacitance and reduce power consumption and cross talk, while increasing signal propagation speed becomes a necessity. The organic dielectrics must possess dielectric constants no higher than 3.0 and should have dielectric constants as low as possible toward a theoretical limit of 1.0. The practical expectation for polymer dielectrics is in the range of 2.2 to 3.0. The organic dielectrics must have glass transition temperatures above 300° C. and as high as possible toward 450° C., a value determined by the thermal stability of organic polymers. The organic dielectrics should also be easily processed, preferably, by standard spin-bake-cure processing techniques. The organic dielectrics should also be free from moisture and out-gassing problems, in addition to having expected adhesive and gap-filling qualities, and dimensional stability towards thermal cycling, etching, and chemical mechanical polishing processes.

Arylene ether polymers, such as poly(arylene ether) (PAE), poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK), and poly(naphthylene ether) (PNE) comprising different polymer designs that include homopolymers, block or random copolymers, polymer blends, interpenetrating polymer networks (IPNs), and semi-interpenetrating polymer networks (SIPNs), are materials that have been identified as organic dielectrics.

Taking advantage of the low dielectric property of these organic materials requires the IC industry to make a significant shift in its processing paradigm. New processing approaches, such as the use of spin-coating, require selection of appropriate solvents for formulation of the spin-on polymer solution, cleaning, edge-bead removal, and wafer backside rinsing. Desirable formulations will provide spin-coated polymer dielectric films with excellent uniformity, a wide thickness range from hundreds of angstroms to hundreds of microns, very low out-gassing at high temperature, excellent gap-filling to 0.1 micron, excellent local, regional and global planarization, and ease of wafer edge bead removal and wafer backside rinsing. In addition, the spin-on dielectric polymer solution should be easily filtered to minimize its manufacturing cost. Finally, the solution must be environmentally acceptable.

While conventional alcoholic solvents media used for spin-on glasses, familiar to IC engineers, are obvious solvent candidates, they cannot necessarily be applied to organic materials. Their environmental benevolence, in many cases, ease in clean up, and low viscosity features are much desired. Ketonyl and other aprotic solvents have been used for photoresists and polymer dielectrics. These solvents include methyl ethyl ketone, methyl isobutyl ketone, cyclopentanone, cyclohexanone, cycloheptanone, cyclooctanone, γ-butyrolactone, N-methylpyrrolidinone, N-cyclohexylpyrrolidinone and N,N-dimethylacetamide. Among them, cyclic ketonyl solvents are commonly used as solvents for arylene ether dielectrics. However, cyclic ketones normally are not as miscible with most arylene ether polymer dielectrics as would be desired and the spin-on solutions formulated from these solvents usually yield some extent of striation on the spin-coated film, especially for films with thicknesses greater than 1.5 micron. Serious striation could cause inadequate gap-filling, problems in adhesion of the dielectric film with a substrate and other problems. Additionally, cyclic ketonyl solvents have varying degrees of moisture, pH, and photosensitivities, often exacerbated by heat. Users need to be cognizant of these potential difficulties. For example, cyclopentanone is significantly more sensitive than first thought toward low pH, in addition to its well-known sensitivity toward light, moisture, and high pH. Cyclohexanone is more stable than cyclopentanone and has been a fair solvent for photoresists in the industry. However, cyclohexanone is still sensitive to light and low pH. Furthermore, cyclohexanone is considered to be barely tolerable by the industry due to its very low exposure limit.

To summarize, as knowledge in the application and processing of organic dielectric materials expands, shortcomings among the currently-used cyclic ketonyl solvents are becoming more recognized. It would be desirable to provide process compatible and benign solvents for arylene ether polymer dielectrics. In particular, it would be desirable to provide a family of extremely useful high-boiling point solvents for formulation of spin-on dielectric polymer solutions, edge bead removal of these dielectric films, and wafer backside and spin-coater rinsing.

SUMMARY

In accordance with this invention, there is provided a new family of high boiling point solvents, namely aromatic aliphatic ethers, which are utilized in the formation of spin-on dielectric polymer solutions as well as in the spin-coating process of such materials. The chemical structures of this family of ethers is presented below. Several significant examples of this family are anisole ($C_6H_5OCH_3$, n=1, m=0) and phenetole ($C_6H_5OC_2H_5$, n=2, m=0) with a boiling point of 155 and 170° C., respectively, and 2-, 3-, or 4-methylanisole with a boiling point in the range of 170° C. to 175° C. This solvent family is most appropriately applied to the arylene ether dielectric polymers including poly(arylene ether) (PAE), poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK) and their block or random copolymers and blends. Mixtures of one or more of these solvents may be employed in this invention.

| Solvent | R | $R_1$ to $R_5$ |
|---|---|---|
| 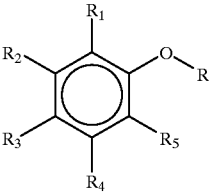 | $C_nH_{2n+1}$<br>n = 1 to 6 | $C_mH_{2m+1}$<br>m = 0 to 3 |

According to another embodiment of the present invention, a process for producing low dielectric films on semiconductor substrates uses a spin-coating solution of a low dielectric constant polymer dissolved in an aromatic aliphatic ether solvent. The films produced by this process advantageously have high thickness uniformity and do not exhibit striation.

DETAILED DESCRIPTION

Aromatic aliphatic ether solvents, such as anisole, methylanisole, and phenetole, have been found to highly dissolve arylene ether polymers. As described above, arylene ether polymers have been identified as useful for forming low dielectric constant organic films.

An example of such a polymer is FLARE™ poly(arylene ether) of AlliedSignal Inc. These polymers have flexible structural moieties built into the uncured structures thereby maintaining the polymers' flexibility and low melt viscosity, which allows them to be formulated for spin-coating. After being spun onto the surface of a wafer, the polymers are thermally activated to undergo a cross-linking reaction and cured to give rise to a $T_g$ value above 250° C. and typically in the range of 300° C. to 450° C., without additional assistance from cross-linking additives.

The chemical structures shown below are two examples of poly(arylene ethers) which may be used as dielectric materials in the IC industry. The dielectric constant for arylene ether polymers typically falls between 2.5 to 3.0, which meets the requirement of next generation dielectrics for ultra large scale integration (ULSI).

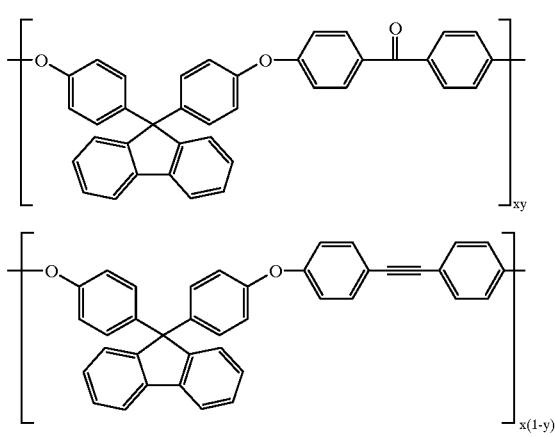

1

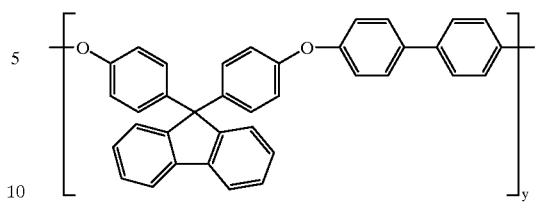

2

In formula 1 above, y is between 0 and 1. In both formulas 1 and 2, x is typically between about 2 and about 200. Preferably, x is between about 2 and about 100.

The polymer represented by formula 1 is disclosed, for example, in. U.S. patent application Ser. No. 08/990,157 filed Dec. 12, 1997 now U.S. Pat. No. 6,124,421, to Lau et al. entitled "Poly(arylene ether) Compositions and Methods of Manufacture Thereof," which is commonly assigned with the present application and incorporated herein by reference.

Another example of a material usefull in forming organic dielectric films is the end-capped poly(arylene ether) homopolymer of the general formula

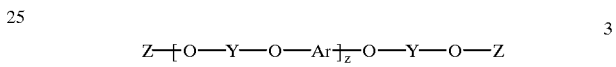

3 where z is between 1 and about 200, Y and Ar are each a divalent arylene radical and Z is a methyl group or a monovalent aryl radical. Polymers of formula 3 are disclosed in U.S. patent application Ser. No. 09/197,478 to Lau et al. entitled "Poly(arylene ether) Homopolymer Compositions and Methods of Manufacture Thereof," which is commonly assigned with the present application and incorporated herein by reference.

According to embodiments of the present invention, aromatic Saliphatic ether solvents are provided which highly dissolve arylene ether polymers. The aromatic aliphatic ethers have the general formula

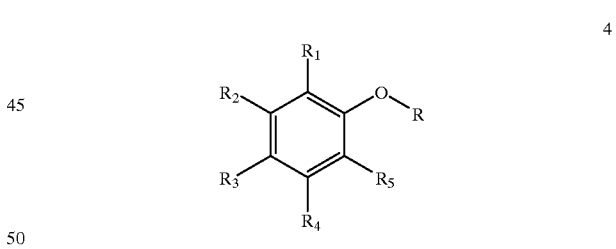

4 where R is $C_nH_{2n+1}$, n=1 to 6 and $R_1$ to $R_5$ is $C_mH_{2m+}$, m=0 to 3. Advantageous examples of aromatic aliphatic ethers include anisole, $C_6H_5OCH_3$, where R=$CH_3$, corresponding to n=1 and $R_1$ to $R_5$=H, corresponding to m=0, and phenetole, $C_6H_5OC_2H_5$, where R=$C_2H_5$ (n=2) and $R_1$ to $R_5$=H (m=0). The boiling points of anisole and phenetole are 155° C. and 170° C., respectively. Other advantageous solvents include 2-, 3-, and 4-methylanisole with a boiling point in the range of 170° C. to 175° C.

In addition to finding application with the poly(arylene ether) polymers of formulas 1 to 3 above, the aromatic aliphatic ethers are appropriately used as solvents with organic dielectric polymers including poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK) and their block or random copolymers and blends. Mixtures of one or more of these solvents may be employed in this invention.

Higher solids content in the solution of arylene ether polymers may be realized by using these proposed solvents instead of the traditional cyclic ketonyl solvents, which will allow higher-thickness films to be easily attained. Additionally, with the same solids content, the viscosity of solutions of anisole, methylanisole or phenetole is significantly lower than that of cyclohexanone and other cyclic ketonyl solutions. The lower viscosity, which results in easy passage by virtue of lower drag, is very beneficial for filtration processes to remove ion contaminants and particles, and therefore reduce the manufacturing cost of the spin-on solutions.

Polymer solutions, in accordance with embodiments of the present invention, are formed by combining aromatic aliphatic ethers and low dielectric constant polymers, such as arylene ether polymers, under ambient conditions in any conventional apparatus having a non-metallic lining. Preferably, a glass-lined apparatus is employed. The resulting solution is comprised of, based upon the total weight of the solution, from about I to about 50%, and preferably from about 5% to about 30% of the polymer dielectric and from about 50% to about 99%, and preferably from about 70% to about 95% of solvent.

The resulting solution is then filtered under ambient conditions via any of the filtration devices well known in the art including, but not limited to commercially available filtration cartridges having the desired porosity. It is generally preferable to use a filtration device having a pore size less than about 1.0 $\mu$m. A typical filtration process uses a pore size of about 0.1 $\mu$m. Alternatively, the solution is filtered sequentially through about 4 filtration means of decreasing pore size, the final pore size being approximately 0.1 $\mu$m or less.

Typically, the solutions are applied to semiconductor wafers using a spin-coating process. However, dip-coating, spray-coating, or other coating methods known in the art, can also be employed. In the spin-coating process, the polymer solution prepared in the manner described above is dispensed onto a silicon wafer substrate at or near its center. In some embodiments, the wafer will remain stationary during the dispense cycle, while in some embodiments, the wafer will turn or spin at a relatively low speed, typically less than about 1000 revolutions per minute (rpm). The dispense cycle is optionally followed by a short rest period and then additional spins, hereinafter referred to as thickness spins, generally between approximately 2000 and 5000 rpm, although other spin speeds may be used, as appropriate. In one typical process, the dispense step includes a 5 second spin at 1000 rpm while the solution is dispensed and a subsequent 1 second spreading spin at 1000 rpm. The dispense step is followed by a 30 second thickness spin at 2000 rpm. The coating process may additionally include the following cleaning steps: a wafer backside rinse (5 second spin at 800 rpm), edge bead removal (2 second spin at 1500 rpm), spin dry (4 second spin at 3000 rpm) and a nozzle rinse (1 second spin at 3000 rpm). The aromatic aliphatic ethers are advantageously used as solvents for the wafer backside rinsing, edge bead removal, and nozzle rinsing steps.

Once the coating process is completed, the coated substrate, that is the substrate coated with the polymer solution, is heated to effect a bake process and a subsequent cure process. Any conventional apparatus known in the art can be employed for these processes. Preferably, the apparatus for the bake process is an integral part of a spin-coating apparatus used for coating the substrate or wafer, although a separate apparatus for curing coatings is also suitable. The bake process can be carried out in an inert atmosphere such as an atmosphere of an inert gas or nitrogen. One commonly employed heating apparatus employs one or more "hot plates" to heat the coated wafer from below. The coated wafer is typically heated for up to about 120 sec at each of several hot plates at successively higher temperatures. Typically, the hot plates are at temperatures between about 70° C. and 350° C. One typical process employs a heating apparatus having three hot plates. First, the wafer is baked for about 60 sec at 150° C. Then the wafer is transferred to a second hot plate for an approximately 60 sec bake period at 200° C. Finally, the wafer is transferred to a third hot plate for a third bake period of approximately 60 sec at 250° C.

A final cure process is preferably employed to complete the curing of the film. The cure is preferably performed in an inert atmosphere, as described above for the bake process. This final cure process can employ a conventional thermal curing apparatus, for example a horizontal furnace with a temperature range of about 300° C. to about 450° C. and preferably from about 375° C. to about 425° C. In a typical furnace cure process, the baked wafer is cured for 30 minutes to one hour at 400° C. at a nitrogen flow rate of 4 liters/min to 20 liters/min.

It will be understood that the above bake and cure processes were described for illustrative purposes only and that other temperatures, durations, and number of bake cycles can be employed, where appropriate.

It has been found that solutions of arylene ether polymers poly(arylene ether), such as those of formulas 1 and 2, formulated in anisole, methylanisole, and phenetole yield totally striation-free films. In contrast, as demonstrated in Example 3 below, films produced from solutions in conventional solvents exhibit striation. Owing to the better polymer solubility, the workable spin speed range in the spinning step is wider than the corresponding cyclohexanone solutions. The standard deviation of uniformity of film spin-coated from anisole, methylanisole, or phenetole solutions over the silicon wafers is found to be lower than that of films spin-coated from the corresponding cyclohexanone solution. For example, the standard deviation of a film formed from an 18 weight % solution of a polymer of formula 1 in phenetole was less than 0.3%. Additionally, the lower viscosity of the anisole, methylanisole, and phenetole solutions permit the polymer dielectric solution to be still effective at filling narrow (<0.15 $\mu$m), high aspect ratio gaps at high spin speed, such as in the 4000 to 5000 rpm range. The wider process window of these solutions yields a wider thickness range for each version of spin-on polymer solution than the corresponding cyclohexanone solution. Furthermore, these solvents are advantageously used for cleaning processes such as edge bead removal, wafer backside rinsing, and general equipment clean up because of the higher miscibility of poly(arylene ether) polymers in aromatic aliphatic ethers than in conventional solvents.

The aromatic aliphatic ethers used in this invention, such as anisole, methylanisole and phenetole, are very stable organic solvents upon exposure to air, strong acid and base even at elevated temperatures. Unlike cyclic ketonyl solvents, no derivatives in anisole, methylanisole, and phenetole are detected by gas chromatography (GC) when they are kept in contact with an acidic medium, for example, a sulfonic acid type resin, in air for days. This greatly minimizes the out-gassing of polymer dielectrics films at temperature of about 400 ° C. and above. Isothermal thermogravimetric analysis (ITGA) at 425 and 450° C. demonstrates significantly less weight loss for the film spin-coated from anisole or methylanisole or phenetole solutions compared with that of films spin-coated from cyclohexanone solution.

Anisole, methylanisole, phenetole, and the other aromatic aliphatic solvents are very benign solvents to the environment and the workplace. Anisole has long been used in the perfume industry and no significant hazardous concerns have ever been raised. High purity anisole, methylanisole, and phenetole with less than 50 ppb for all metals are widely commercially available at competitive prices. Together with all the property improvement on the dielectric film of arylene ether polymers, anisole, methylanisole, phenetole and other aromatic aliphatic ether solvents provide more robust polymer dielectric films for the semiconductor and microelectronic industries.

As a result, spin-on polymer dielectric solutions based on aromatic aliphatic ether solvents, such as anisole, methylanisole and phenetole are benign, provide decreased manufacturing cost for the spin-on dielectric polymer, provide the polymer solutions with the capability to achieve high thickness, wider process windows and a wider thickness range, and provide striation-free polymer dielectric films with improved gap-filling capability, low out-gassing and high glass transition temperatures.

It can be seen that this invention provides benign solvent systems to facilitate manufacturing, processing and application of polymer dielectric materials such as highly processible, high-temperature resistant arylene ethers based polymers as low dielectric constant, low moisture absorption, thermally stable intermetal dielectrics for multilevel interconnection in integrated circuits and microelectronics packaging.

EXAMPLE 1

An 18 weight % solution of the poly(arylene ether) of formula 1 with y=0.5, the FLARE™ material of AlliedSignal, was prepared by dissolving an appropriate weight of the solid polymer in phenetole under ambient conditions in a glass lined reactor. The solution was filtered through a series of four Teflon® filtration cartridges. The filtration cartridges have decreasing nominal pore sizes of 1.0, 0.5, 0.2, and 0.1 μm, respectively.

EXAMPLE 2

Approximately 3 ml of the filtered solution of Example 1 was processed onto the surface of a four inch silicon wafer using a spin coater and hot plate oven track, for example a Silicon Valley Group, Inc. (SVG) Model No. 8828 coater and SVG model No. 8840 oven track. After the solution was dispensed, the wafer was spun at 500 rpm for 5 seconds, followed by a 5 second rest and a 60 second spin at various speeds between 1000 and 5000 rpm, as reported below. The coated wafer was baked at 180° C. for one minute. The baked wafer was then cured in a nitrogen atmosphere in a furnace set initially at 200° C. followed by a ramp to 400° C. at 5° C./minute and a ramp to 425° C. at 1.5° C./minute, held at 425° C. for one hour, followed by a cool down to 100° C. Properties of the resulting films are given below in Table 1.

TABLE 1

Properties of Films from 18 wt % Solution in Phenetole as a Function of Spin Speed

| Property | 1000 rpm | 1500 rpm | 2000 rpm | 3000 rpm | 4000 rpm | 5000 rpm |
| --- | --- | --- | --- | --- | --- | --- |
| Gap fill | <0.15 μm | <0.15 μm | <0.15 μm | <0.15 μm | <0.15 μm | <0.15 μm |
| Planarization | 75% | 80% | 75% | 70% | 68% | 65% |
| Thickness* | 1.801 Å | 1.449 Å | 1.260 Å | 1.033 Å | — | — |
| Uniformity** | 0.44% | 0.18% | 0.23% | 0.27% | — | — |
| Striation*** | None | None | None | None | — | — |

*Thickness after cure
**Standard deviation of five measurements
***Determined by examination under optical microscope

EXAMPLE 3

13 wt % solutions of FLARE™ in the various conventional solvents were prepared and processed into films as described in Examples 1 and 2 above for comparison with a polymer solution in phenetole. Films were graded on thickness uniformity, defined as standard deviation <0.3% and optical quality, defined as absence of striation on examination under an optical microscope.

TABLE 2

Film Quality as Function of Solvent

| Solvent | Uniformity | Optical Quality |
| --- | --- | --- |
| Phenetole | Pass | Pass |
| 1:1 cyclohexanone/γ-butyrolactone | Fail | Fail |
| 1:1 cyclohexanone/N-methylpyrrolidinone | Fail | Fail |
| 1:1 N-methylpyrrolidinone/γ-butyrolactone | Fail | Fail |
| 4:1 cyclohexanone/diphenyl ether | Pass | Fail |
| Diglyme | Fail | Fail |
| N,N-dimethylacetamide | Fail | Fail |

EXAMPLE 4

A poly(arylene ether) homopolymer of formula 3 in which Y, Ar, and Z are:

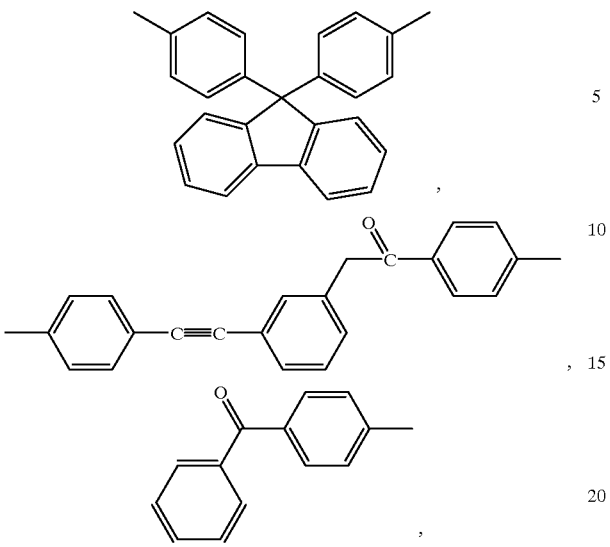

respectively was prepared and combined with anisole to form an 18 wt % solution. After 3 ml of the solution was dispensed, the wafer was spun at 500 rpm for 5 seconds, followed by a 5 second rest and a 60 second spin at 2000 rpm. The wafer was cured at 425° C. for one hour. Film thickness was 1.06 µm after curing.

We claim:

1. A polymeric solution comprising an organic polymer dissolved in an aromatic aliphatic ether solvent, wherein the polymer is selected from the group consisting of the formulas:

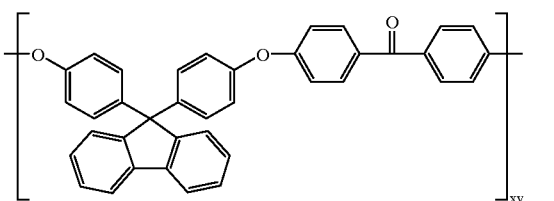 1

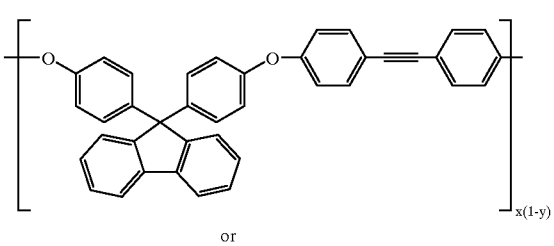

or

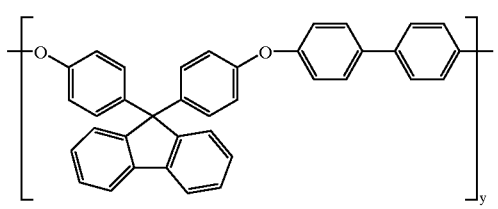 2 wherein, in formula 1, y=0–1, and in both formulas 1 and 2, x is about 2 to about 200 or  3 wherein, in formula 3, Y, Ar, and Z are

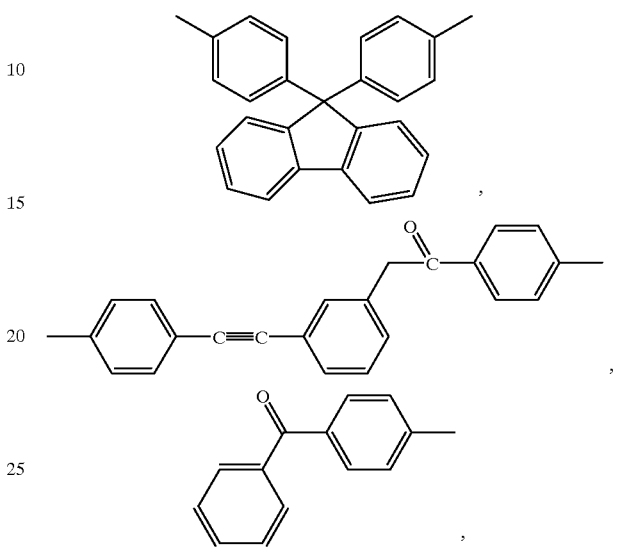

respectively, and z is between 1 and about 200.

2. The solution of claim 1 wherein said solvent is a solvent having the formula

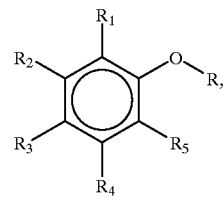

wherein $R=C_nH_{2n+1}$ and n=1 to 6, and wherein each of $R_1$ to $R_5$ is independently $C_mH_{2m+1}$, wherein m=0 to 3.

3. The solution of claim 1 wherein said solvent is selected from the group consisting of anisole, methylanisole, phenetole and mixtures thereof.

4. The solution of claim 1 wherein said polymer comprises from about 1 to about 50 weight percent of said solution.

5. The solution of claim 4 wherein said polymer comprises from about 5 to about 30 weight percent of said solution.

6. A spin-on dielectric solution comprising the solution of claim 1.

7. A process for making a dielectric film on a substrate comprising:

providing a solution of an organic polymer dissolved in an aromatic aliphatic ether solvent; and coating said solution onto said substrate.

8. The process of claim 7 wherein said solvent is a solvent having the formula

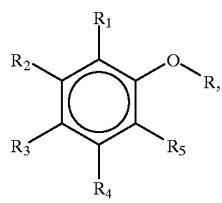

wherein $R=C_nH_{2n+1}$ and n=1 to 6, and wherein each of $R_1$ to $R_5$ is independently $C_mH_{2m+}$, wherein m=0 to 3.

9. The process of claim 7, wherein said solvent is selected from the group consisting of anisole, methylanisole, phenetole and mixtures thereof.

10. A microelectronic device comprising a dielectric film formed on a substrate by the process comprising:

providing a solution of an organic polymer dissolved in an aromatic aliphatic ether solvent; and coating said solution onto said substrate.

* * * * *